United States Patent
Hatol et al.

(10) Patent No.: US 11,177,066 B2
(45) Date of Patent: Nov. 16, 2021

(54) EGG-SHAPED CONTINUOUS COILS FOR INDUCTIVE COMPONENTS

(71) Applicant: Astec International Limited, Kowloon (HK)

(72) Inventors: Angelito Hatol, Antipoto (PH); John Faustino Boqueo Begino, III, Pasig (PH)

(73) Assignee: Astec International Limited, Kowloon (HK)

( * ) Notice: Subject to any disclaimer, the term of this patent is extended or adjusted under 35 U.S.C. 154(b) by 458 days.

(21) Appl. No.: 15/836,509

(22) Filed: Dec. 8, 2017

(65) Prior Publication Data
US 2019/0180922 A1   Jun. 13, 2019

(51) Int. Cl.
*H01F 27/30* (2006.01)
*H01F 27/28* (2006.01)
*H01F 17/04* (2006.01)
*H05K 1/18* (2006.01)

(52) U.S. Cl.
CPC ........ *H01F 27/2847* (2013.01); *H01F 17/043* (2013.01); *H01F 27/2866* (2013.01); *H01F 27/306* (2013.01); *H05K 1/18* (2013.01); *H01F 27/2895* (2013.01); *H01F 2017/046* (2013.01)

(58) Field of Classification Search
USPC ........................................ 336/199, 192, 180
See application file for complete search history.

(56) References Cited

U.S. PATENT DOCUMENTS

| | | | | |
|---|---|---|---|---|
| 4,901,048 | A | * | 2/1990 | Williamson ........ H01F 27/2847 336/180 |
| 5,134,770 | A | * | 8/1992 | Yerman .............. H01F 17/0006 29/602.1 |
| 6,204,745 | B1 | | 3/2001 | Liu et al. |
| 7,479,863 | B2 | | 1/2009 | Kit et al. |
| 7,982,576 | B2 | | 7/2011 | Feng et al. |
| 8,207,807 | B2 | * | 6/2012 | Kikuchi .............. H01F 27/2828 336/188 |
| 2010/0026437 | A1 | * | 2/2010 | Lin ..................... H01F 27/2847 336/192 |
| 2010/0109831 | A1 | | 5/2010 | Podevels et al. |
| 2012/0268232 | A1 | * | 10/2012 | Yamada .............. H01F 27/2823 336/222 |
| 2014/0210584 | A1 | * | 7/2014 | Blow ................... H01F 27/022 336/173 |
| 2014/0328027 | A1 | * | 11/2014 | Zhang ................. H01F 27/2823 361/728 |
| 2016/0225514 | A1 | | 8/2016 | Cheng et al. |
| 2018/0076704 | A1 | * | 3/2018 | Kneller .............. H01F 27/2895 |

OTHER PUBLICATIONS

Dongguan Youhui Machinery Co., Ltd., Custom Wireless Charger Coil for Winding/Copper Wire Inductor Coil, Guangdong, China.
BT Coil Co., Ltd., http://www.btcoil.com/product.php?cid=62, 2002-2015 (2 pages).

* cited by examiner

*Primary Examiner* — Shawki S Ismail
*Assistant Examiner* — Kazi S Hossain (57) ABSTRACT

A continuous coil for an inductive component includes a plurality of turns formed by at least one conductor. The continuous coil is substantially egg-shaped. Other example coils, transformers, etc. are also disclosed.

20 Claims, 6 Drawing Sheets

EGG-SHAPED CONTINUOUS COILS FOR INDUCTIVE COMPONENTS

FIELD

The present disclosure relates to egg-shaped continuous coils for inductive components.

BACKGROUND

This section provides background information related to the present disclosure which is not necessarily prior art.

Inductive components such as transformers, coupled inductors, etc. may include two or more windings. For example, a transformer includes one or more primary windings and secondary windings. These windings are commonly wire windings or plate windings. Sometimes, these windings are circular-shaped and/or ellipse-shaped, and may be interleaved together. In some examples, turns of the secondary plate windings are connected together with external interconnections (e.g., a bus bar, a circuit board, etc.).

SUMMARY

This section provides a general summary of the disclosure, and is not a comprehensive disclosure of its full scope or all of its features.

According to one aspect of the present disclosure, a continuous coil for an inductive component is disclosed. The coil includes a plurality of turns formed by at least one conductor. The continuous coil is substantially egg-shaped.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts and/or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
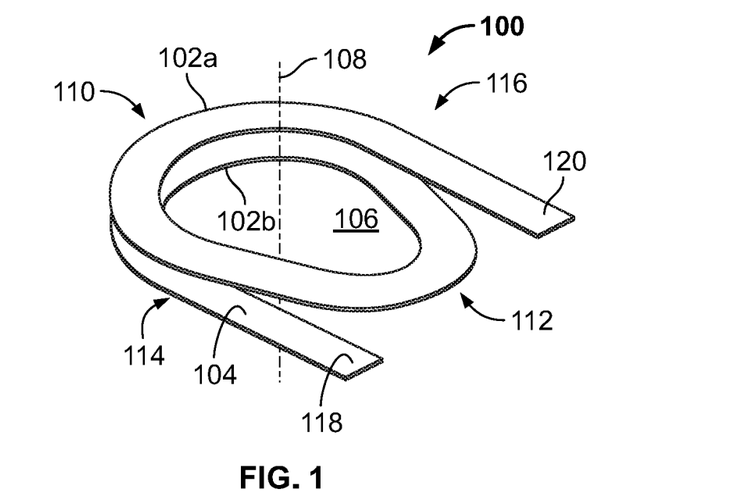
FIG. 1 is an isometric view of an egg-shaped continuous coil having two turns according to one example embodiment of the present disclosure.

A continuous coil for an inductive component according to one example embodiment of the present disclosure is illustrated in FIG. 1 and indicated generally by reference number 100. As shown in FIG. 1, the continuous coil 100 includes multiple turns 102a, 102b formed by at least one conductor 104. The continuous coil 100 is substantially egg-shaped.

As shown, the substantially egg-shaped coil 100 is formed by manipulating the conductor 104 to produce the turns 102a, 102b. These turns 102a, 102b define an opening 106 with an axis 108. When the coil 100 is viewed in the axial direction relative to the axis 108, the coil 100 is substantially egg-shaped. In other words, the coil 100 forms an oval-like shape having opposing curved ends 110, 112 and non-parallel opposing sides 114, 116 between the curved ends 110, 112. As shown, the curved ends 110, 112 are sized differently. For example, and as shown in FIG. 1, the radius of curvature of the end 110 is different than the radius of curvature of the end 112. In the particular example of FIG. 1, the radius of curvature of the end 110 is larger than the radius of curvature of the end 112. In other examples, the radius of curvature of the end 112 may be larger than the radius of curvature of the end 110.

In the specific embodiment of FIG. 1, the radius of curvature on the inside of the curved end 110 is about 15 mm, the radius of curvature on the outside of the curved end 110 may be about 22 mm, the radius of curvature on the inside of the curved end 112 may be about 9.38 mm, and the radius of curvature on the outside of the curved end 112 may be about 16.38 mm. As such, the inside radius of curvature of the curved end 110 is about sixty percent larger than the inside radius of curvature of the curved end 112, and the outside radius of curvature of the curved end 110 is about thirty-five percent larger than the outside radius of curvature of the curved end 112. In other embodiments, the inside/outside radiuses of curvature of the curved ends 110, 112 may be more or less than the specific dimensions mentioned above.

As explained above, the substantially egg-shaped coil 100 is a continuous coil. For example, and as shown in FIG. 1, the coil 100 may be formed from one continuous conductor 104. Alternatively, the continuous coil 100 may be formed of two or more conductors attached (e.g., soldered, welded, bonded, etc.) together as further explained below.

In some embodiments, the continuous coil 100 may include leads for coupling to one or more components. For example, in the particular example of FIG. 1, the continuous coil 100 includes two leads 118, 120. These leads 118, 120 may be considered an input lead and/or an output lead. The leads 118, 120 may be a portion of the conductor 104, as shown in FIG. 1. Alternatively, the leads 118, 120 may be distinct conductors connected to the ends of the conductor 104.

As shown in FIG. 1, the leads 118, 120 extend from opposing sides of the coil 100. For example, the lead 118 extends from a bottom side of the coil 100 and the lead 120 extends from a top side of the coil 100. In other embodiments, the leads 118, 120 may extend from the same side of the coil 100, as further explained below.

Additionally, the leads 118, 120 extend in parallel planes. For example, the lead 118 extends in a horizontal plane extending across the bottom side of the coil 100 and the lead 120 extends in a horizontal plane extending across the top side of the coil 100. These planes extending across opposing sides of the coil 100 are substantially parallel. In other embodiments, the leads 118, 120 may extend in non-parallel planes.

Figure 3:
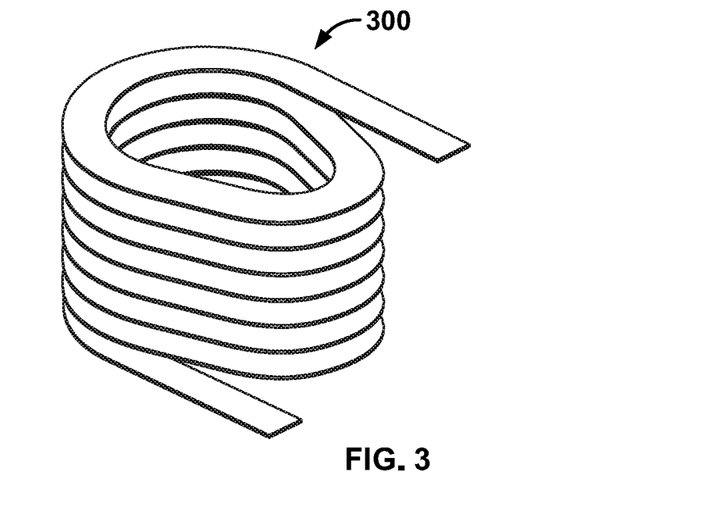
FIG. 3 is an isometric view of an egg-shaped continuous coil having eight turns according to yet another example embodiment.

In the particular embodiment of FIG. 1, the coil 100 includes two turns. In other examples, the coil 100 may include more than two turns. For example, the coil 100 may include three turns, five turns, ten turns, etc. depending on, for example, costs, specifications (e.g., electrical specifications, physical restrictions, etc.), etc. For instance, FIG. 3 illustrates a continuous coil 300 substantially similar to the coil 100 of FIG. 1, but includes eight turns.

Referring back to FIG. 1, the substantially egg-shaped coil 100 may be a winding of an inductive component such as a transformer, a coupled inductor, etc. For example, the coil 100 may be one of the windings of a coupled inductor. In other examples, the coil 100 may be a primary winding, a secondary winding, an auxiliary winding, etc. of a transformer. In such examples, another coil may be employed with the coil 100 in the transformer. For example, if the coil 100 of FIG. 1 is a secondary winding of a transformer, another coil may represent a primary winding, an auxiliary winding, another secondary winding, etc. of the transformer.

Figure 2:
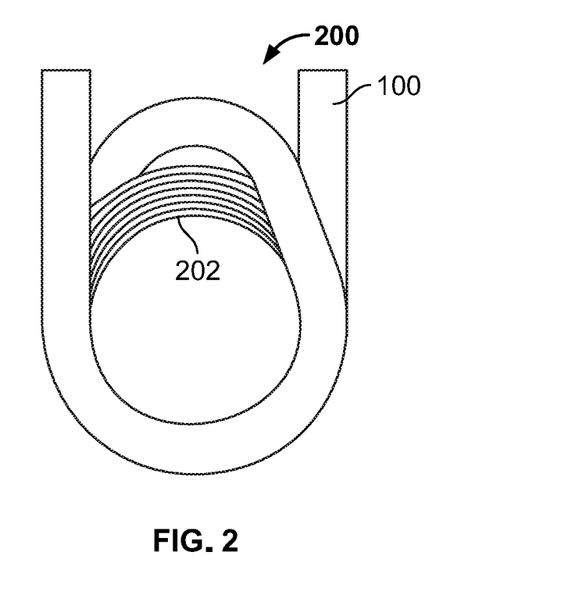
FIG. 2 is a top view of an inductive component including the continuous coil of FIG. 1 and a single layer coil interleaved with the continuous coil, according another example embodiment.

For instance, FIG. 2 illustrates a transformer 200 including the substantially egg-shaped coil 100 of FIG. 1 and another coil 202 interleaved with the coil 100. Specifically, the coil 202 is positioned between (e.g., interleaved with) the two turns of the continuous coil 100. In the particular example of FIG. 2, the coil 100 is a secondary winding and the coil 202 is a primary winding. In other examples, the coil 100 and/or the coil 202 may each represent another suitable winding as explained above.

The coil 202 may have a substantially circular shape formed of one or more continuous conductors (e.g., one or more insulated wires). In other embodiments, the coil 202 may have another suitable shape including, for example, an oval shape, a square shape, a pentagon shape, etc. and/or be formed of multiple distinct conductors coupled together.

Additionally, the coil 202 of FIG. 2 includes a single layer formed from the continuous conductor(s) and turns. In the specific example of FIG. 2, the coil 202 includes seven turns which may be adhered to each via a bonding material (e.g., a heat activated adhesive, tape, etc.). In other examples, the coil 202 may include two or more layers as further explained below.

In some examples, the transformer 200 may experience a substantially balanced coupling between the coils 100, 202. For example, when the coils 100, 202 are interleaved, the coils 100, 202 may experience an improved balanced coupling as compared to other conventional circular-shaped, ellipse-shaped, etc. interleaved coils. This is at least partly due to the shape of the coils 100, 200. For instance, current flowing through the coils 100, 202 generate magnetic fields about the coils. If the egg-shaped coil 100 substantially overlaps the circular coil 202 (as shown in FIG. 2) such that the offset between the coils is minimized, more of the generated magnetic fields may cancel out as compared to other conventional interleaved coils. As a result, magnetic flux (e.g., in a core), the leakage inductance and losses (e.g., AC losses) are reduced.

Figure 4:
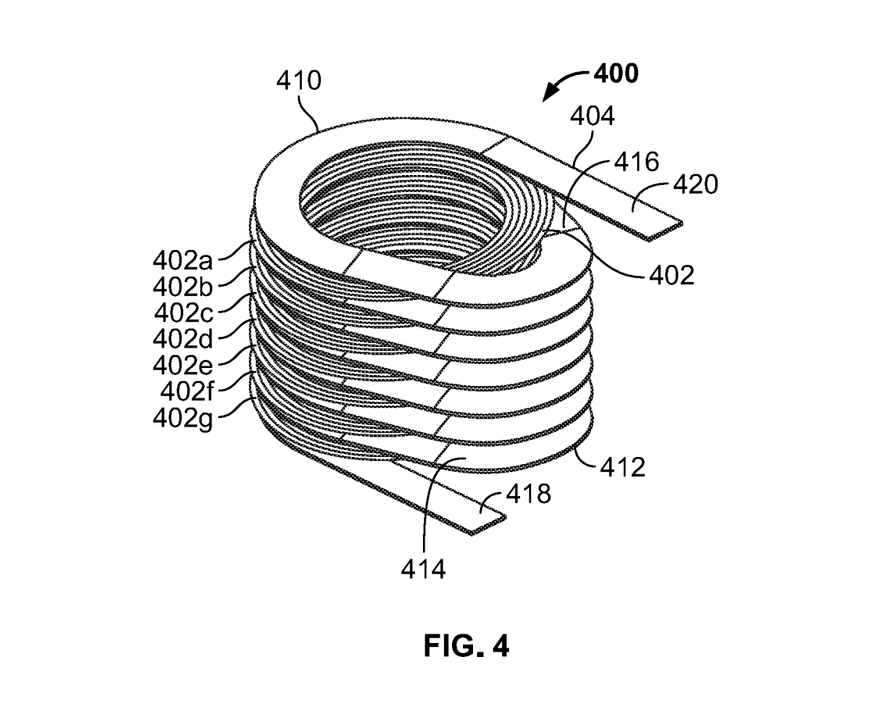
FIG. 4 is an isometric view of a transformer including the continuous coil of FIG. 3 and a multilayer coil interleaved with the continuous coil, according another example embodiment.

FIG. 4 illustrates another transformer 400 including a coil 402 (e.g., a primary winding) and a substantially egg-shaped coil 404 (e.g., a secondary winding). The coil 402 is substantially similar to the coil 202 of FIG. 2, but includes seven layers 402a-g spaced apart from each other. Each layer 402a-g of the coil 402 includes seven turns optionally adhered to each other.

The egg-shaped coil 404 is substantially similar to the coil 300 of FIG. 3, but includes multiple conductors (e.g., segments) attached together to form the continuous coil. For example, the egg-shaped coil 404 of FIG. 4 includes eight turns formed of multiple opposing curved end segments 410, 412, multiple opposing side segments 414, 416 between the curved end segments, and two lead segments 418, 420 attached together to form the continuous coil. Specifically, the coil 404 includes eight curved end segments 410, seven curved end segments 412 and seven side segments 414, 416. The leads 418, 420 extend from top/bottom sides and in parallel planes, as explained above.

As shown in FIG. 4, the coil 402 is interleaved with the substantially egg-shaped coil 404. Specifically, each layer 402a-g of the coil 402 is positioned between two adjacent turns of the coil 404. For example, the layer 402a is positioned between the first and second turns (e.g., the top two turns) of the coil 404, the layer 402b is positioned between the second and third turns of the coil 404, etc. As such, in the specific example of FIG. 4, the transformer 400 includes one primary coil layer per every two secondary coil turns. In other embodiments, the coil 402 may include two or more layers positioned between each two adjacent turns of the coil 404.

Figure 5:
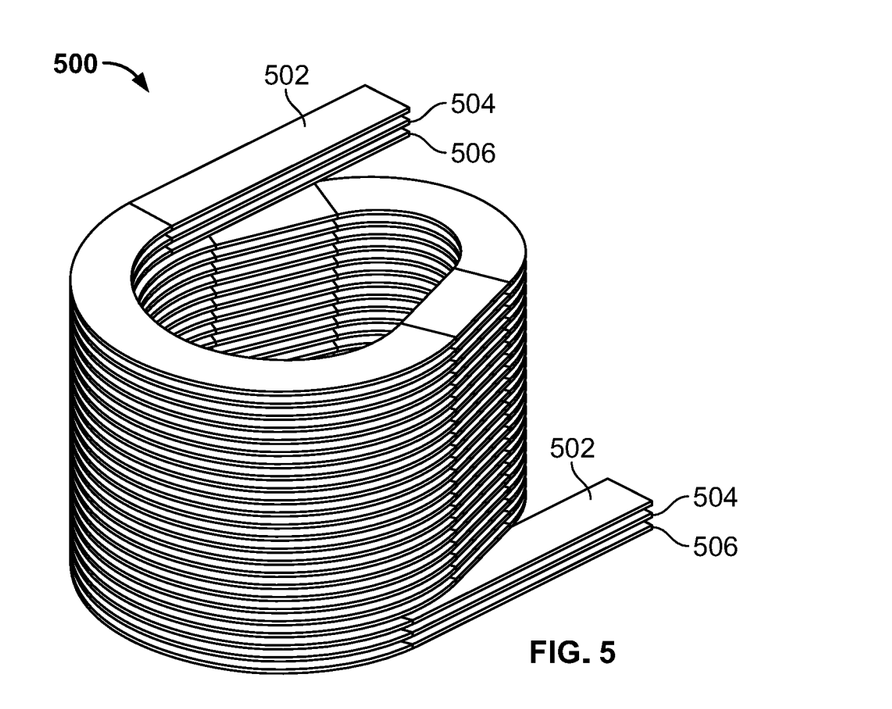
FIG. 5 is an isometric view of three egg-shaped continuous coils wound in a parallel configuration according yet another example embodiment.

In some embodiments, the transformers disclosed herein may include a winding having two or more coils extending in a parallel configuration. For example, FIG. 5 illustrates three coils 502, 504, 506 forming a group of coils (collectively 500). The coils 502, 504, 506 each are substantially similar to the coil 404 of FIG. 4. For instance, the coils 502, 504, 506 each includes eight turns wound together in a parallel configuration so that the turns of each coil are substantially aligned. Although not shown, portions (e.g., inputs, outputs, etc.) of the coils 502, 504, 506 may be coupled together so that the coils 502, 504, 506 are electrically coupled together in parallel, series, series-parallel (e.g., a center-tapped transformer winding). Alternatively, the coils 502, 504, 506 may be three independent windings.

Figure 6:
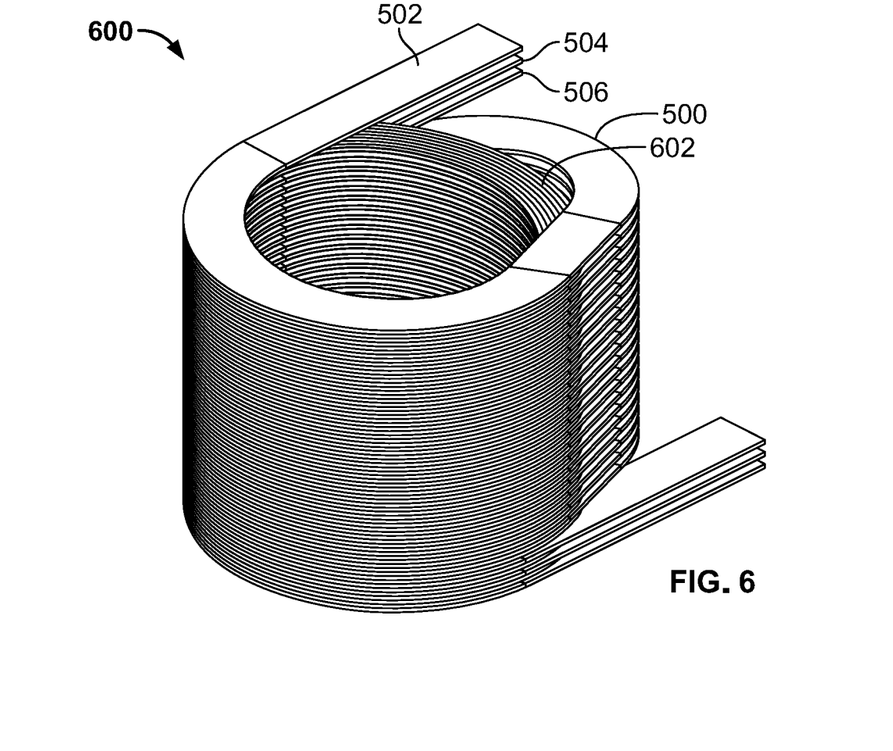
FIG. 6 is an isometric view of a transformer including the three coils of FIG. 5 and a multilayer coil interleaved with the winding according yet another example embodiment.

FIG. 6 illustrates a transformer 600 including the coils 500 of FIG. 5 and a coil 602. The coils 500 (e.g., the three coils 502, 504, 506) may form a secondary winding of the transformer 600, and the coil 602 may form a primary winding of the transformer 600. In other examples, the coils 500 may form the primary winding or an auxiliary winding of the transformer 600, and the coil 602 may form the secondary winding or an auxiliary winding of the transformer 600.

The coils 500 and the coil 602 may be interleaved together. For example, the winding 602 may include multiple layers, each of which is positioned between two adjacent coils 502, 504, 506. In other words, a first layer of the winding 602 may be positioned between an upper most turn of the coil 502 and an upper most turn of the coil 504, a second layer of the winding 602 may be positioned between the upper most turn of the coil 504 and an upper most turn of the coil 506, a third layer of the winding 602 may be positioned between the upper most turn of the coil 506 and the next (e.g., the second) turn of the coil 502, etc.

The coils of FIGS. 1-6 may be considered helical coils. For example, the conductor(s) forming the coils may be wound in a spiral pattern so that the turns are sequentially stacked on top of each other. As such, the multiple turns of each coil may substantially overlap each other, as shown in FIGS. 1-6. Alternatively, in some embodiments the coils may be wound in a manner such that the turns do not substantially overlap each other.

Figure 7:
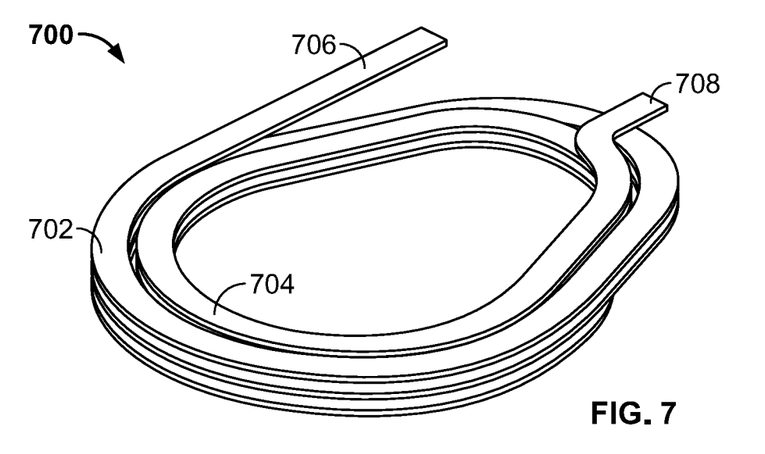
FIG. 7 is a top isometric view of an egg-shaped continuous coil having inner turns and outer turns according another example embodiment.
Figure 8:
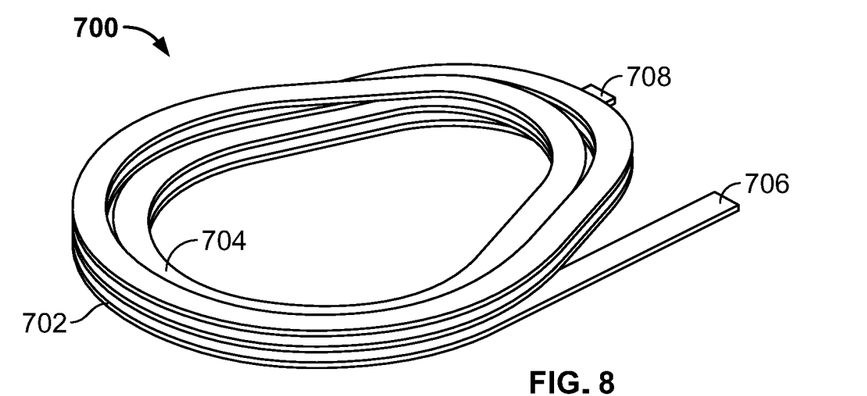
FIG. 8 is a bottom isometric view of the continuous coil of FIG. 7.

For example, FIGS. 7 and 8 illustrate a continuous coil 700 having turns which do not substantially overlap each other. For example, the continuous coil 700 includes five turns formed from one or more conductors. Some of the turns 702 are wound in an outer turn path and other turns 704 are wound in an inner turn path positioned within the outer turn path. As such, the turns of the coil 700 are not concentrically aligned with each other.

In the specific example of FIGS. 7 and 8, substantially all of three turns are wound in the outer turn path, and the remaining turns (e.g., slightly more than two turns) are wound in the inner turn path. Some of the outer turns may be on the same plane as some of the inner turns. For example, one of the inner turns may substantially align with (e.g., be in the same plane as) one of the outer turns, and another inner turn may substantially align with another one of the outer turns. In other examples, more or less portions of the turns may be wound in the outer and/or inner turn paths, the inner turns and the outer turns may not be substantially aligned in the same planes, etc. if desired.

As shown in FIGS. 7 and 8, the coil 700 includes two leads 706, 708. These leads 706, 708 may be similar to the leads 118, 120 of FIG. 1. In the particular example of FIGS. 7 and 8, the leads 706, 708 extend from the same side of the coil 700. In some examples, the leads 706, 708 may extend in substantially the same plane.

Figure 9:
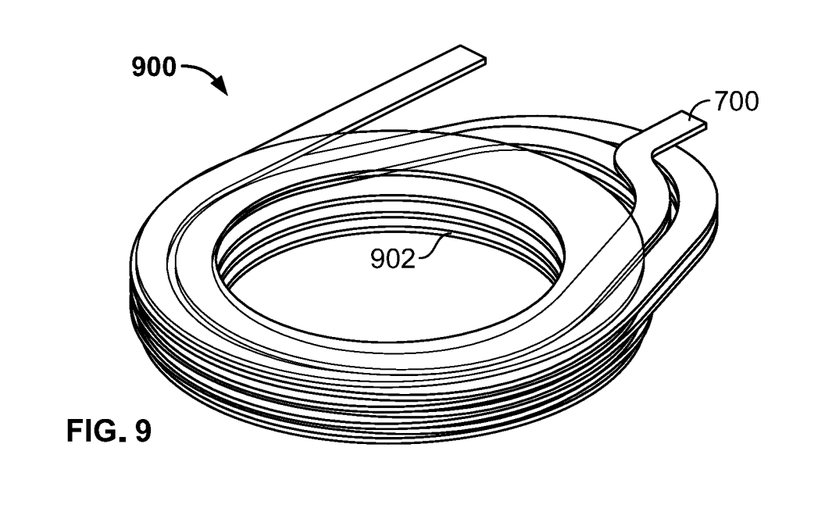
FIG. 9 is a top isometric view of a transformer including the continuous coil of FIG. 7 interleaved with another coil according yet another example embodiment.
Figure 10:
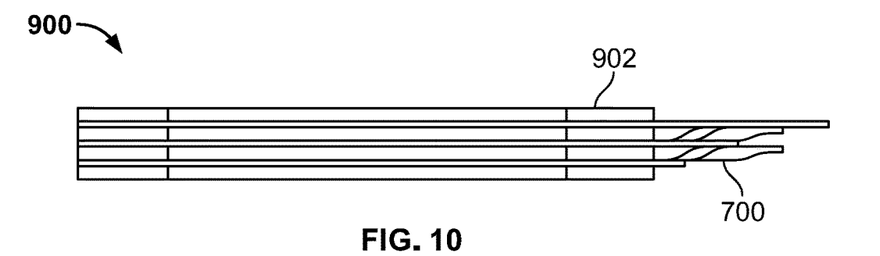
FIG. 10 is a side view of the transformer of FIG. 9.

FIGS. 9 and 10 illustrate a transformer 900 including the continuous coil 700 of FIGS. 7 and 8 and another coil 902 interleaved with the coil 700. Specifically, the coil 902 may be substantially similar to the coils 402 of FIG. 4, but includes four layers. Each layer of the coil 902 may be positioned between adjacent turns of the coil 700, as explained above. For example, and as shown in FIGS. 9 and 10, one layer of the coil 902 may be positioned on an exterior facing side of the coil 700, another layer of the coil 902 may be positioned between two adjacent outer turns and two corresponding adjacent inner turns of the coil 700, etc.

Figure 11:
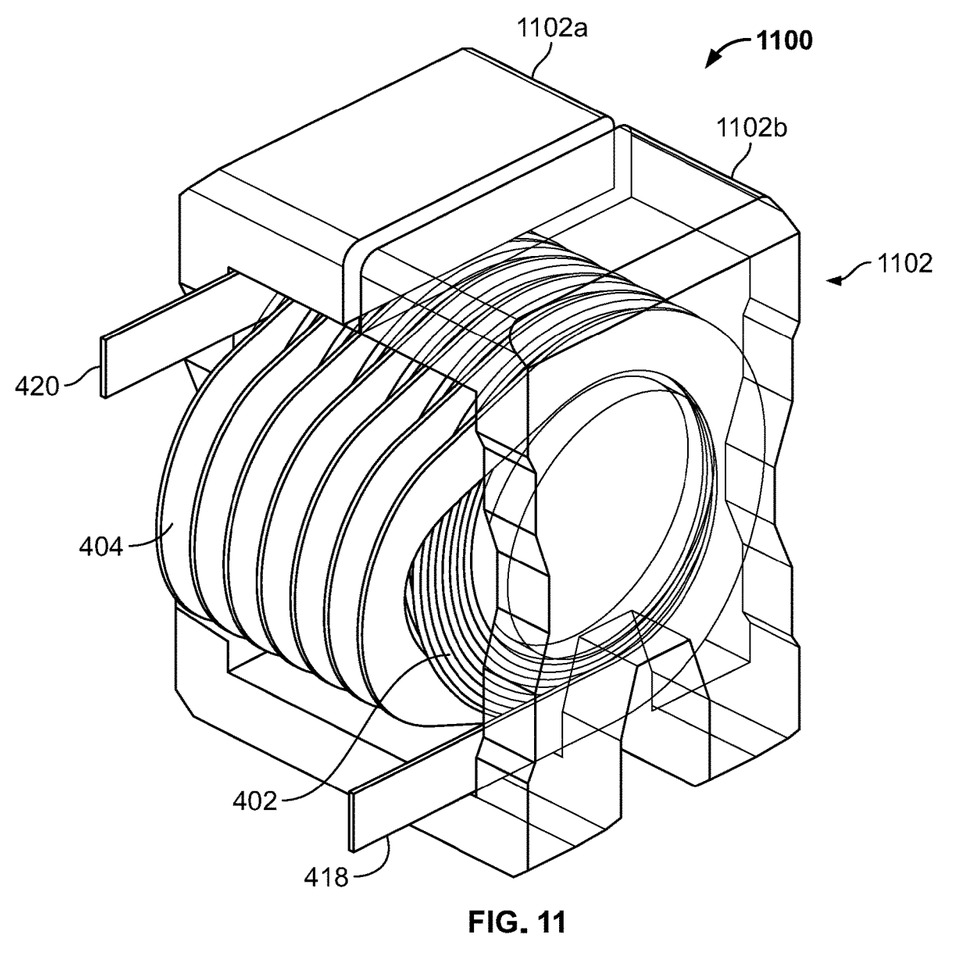
FIG. 11 is an isometric view of the transformer of FIG. 4 including a core according another example embodiment.

FIG. 11 illustrates a transformer 1100 including a core 1102 (e.g., a ferrite core, etc.) and the interleaved coils 402, 404 of FIG. 4 positioned about the core 1102. In particular example of FIG. 11, the core includes two "E" shaped core sections 1102a, 1102b (collectively the core 1102). In other embodiments, the core 1102 may include more or less core sections and/or have other suitable shape(s) if desired. In the particular example of FIG. 11, the coil 402 and the coil 404 may form the primary winding and the secondary winding, respectively, of the transformer 1100.

As shown in FIG. 11, the leads 418, 420 of the secondary coil 404 extend from the transformer 1100. These leads 418, 420 may couple to one or more components such as a circuit board (e.g., a printed circuit board, etc.) without requiring an external interconnection (e.g., a bus bar, another circuit board, etc.) between the turns of the secondary coil 404 as is conventional with known secondary coils employed in interleaved configurations. Thus, by employing the secondary coil 404 with the primary coil 402 (and/or any of the other coils disclosed herein), external interconnection(s) between the turns of the continuous coil 404 may be eliminated.

In some embodiments, the coils disclosed herein may include multiple layers as explained above. For example, FIGS. 12 and 13 each illustrate a portion of a transformer 1200, 1300 including a core 1202 and coils 1204, 1206, 1304, 1306 interleaved with each other. The coils 1206, 1306 are continuous coil substantially similar to the continuous coil disclosed herein. In the particular examples of FIGS. 12 and 13, the coils 1204, 1304 form the primary windings of the respective transformers 1200, 1300, respectively, and the coils 1206, 1306 form the secondary windings of the transformers 1200, 1300, respectively.

Figure 12:
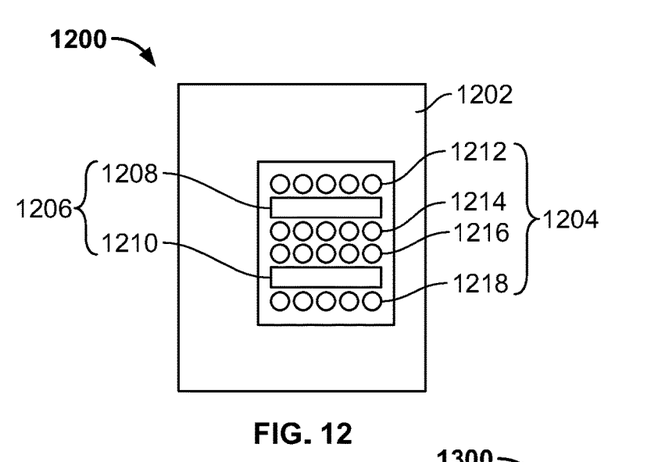
FIG. 12 is a sectional view of a portion of a transformer including a continuous coil with two turns and a multilayer coil according yet another example embodiment.

As shown in FIG. 12, the secondary coil 1206 includes two turns 1208, 1210, and the primary coil 1204 includes four layers 1212, 1214, 1216, 1218 interleaved with the turns of the coil 1206. The layers 1212, 1214, 1216, 1218 each include five turns. The layer 1212 is positioned on an exterior facing side (e.g., a top side) of the secondary coil turn 1208 and the layer 1218 is positioned on an exterior facing side (e.g., a bottom side) of the secondary coil turn 1210. The layers 1214, 1216 of the coil 1204 are positioned between the secondary coil turns 1208, 1210.

Figure 13:
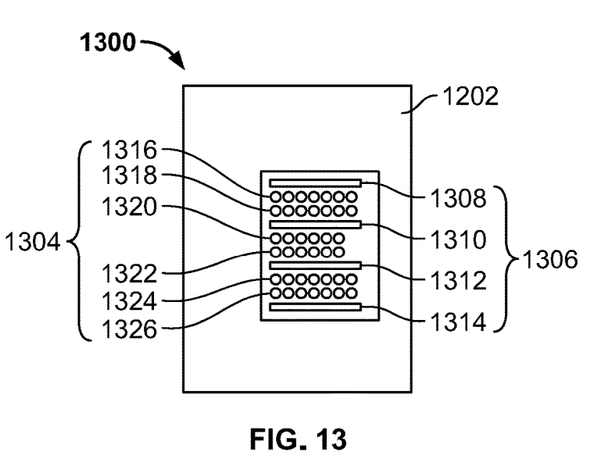
FIG. 13 is a sectional view of a portion of a transformer including a continuous coil with four turns and a multilayer coil according yet another example embodiment.

In the example transformer 1300 of FIG. 13, the secondary coil 1306 includes four turns 1308, 1310, 1312, 1314, and the primary coil 1304 includes six layers 1316, 1318, 1320, 1322, 1324, 1326 interleaved with the secondary coil turns. The transformer 1300 may experience reduced proximity losses as compared to the transformer 1200 due to, for example, the increase in the secondary coil turns and primary coil layers. Additionally, the coils 1304, 1306 of FIG. 13 may include smaller (e.g., thinner) conductors as compared to the coils 1204, 1206 of FIG. 12. For example, the thickness of the secondary coil 1206 may be about 1.0 mm while the thickness of the secondary coil 1306 may be about 0.5 mm. This reduced size may improve material (e.g., copper, etc.) utilization in the coils.

As a result of these transformer differences, the transformer 1300 may have an improved balanced coupling between the coils 1304, 1306 as compared to the coils 1204, 1206 of the transformer 1200. In turn, this may lower leakage inductance and reduce AC resistance related losses. For example, the leakage inductance in the transformer 1200 may be 0.827 uH for the primary coil 1204 and 0.0021 uH for the secondary coil 1206, and the leakage inductance in the transformer 1300 may be 0.702 uH for the primary coil 1304 and 0.0017 uH for the secondary coil 1306. Additionally, and as shown in Table 1 below, the AC/DC ratio between the coils 1204, 1206 in the transformer 1200 may be 2.06/1.87 while the AC/DC ratio between the coils 1304, 1306 in the transformer 1300 may be 1.15/1.54, signifying a reduction in AC related losses in the transformer 1300 as compared to the transformer 1200.

TABLE 1

| | | | AC/DC Ratio | | Resistance (mohm) | |
|---|---|---|---|---|---|---|
| | Freq | Harmonics | Pri | Sec | Pri | Sec |
| Transformer 1200 | DC | 0 | N/A | N/A | 62.62 | 0.16 |
| | 100 kHz | 1 | 2.062 | 1.869 | 129.13 | 0.29 |
| Transformer 1300 | DC | 0 | N/A | N/A | 108.53 | 0.15 |
| | 100 kHz | 1 | 1.15 | 1.54 | 124.97 | 0.24 |

As shown in FIG. 13, the layers 1316, 1318, 1324, 1326 each include seven turns, and the layers 1320, 1322 each include six turns. Additionally, the layers 1316, 1318 are interleaved between the secondary coil turns 1308, 1310, the layers 1320, 1322 are interleaved between the secondary coil turns 1310, 1312, and the layers 1324, 1326 are interleaved between the secondary coil turns 1312, 1314.

Figure 14:
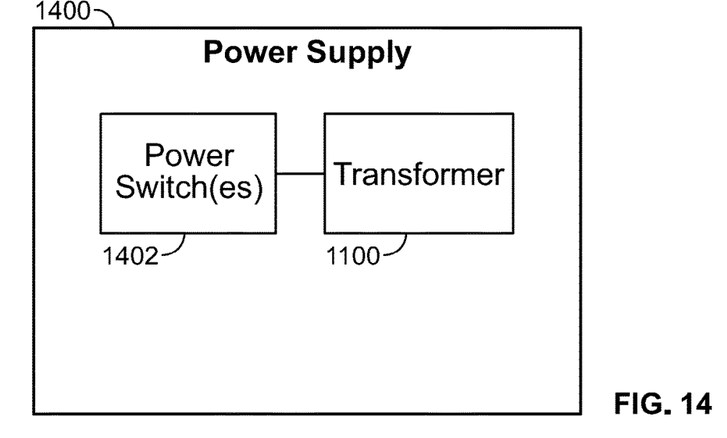
FIG. 14 is a power supply including a transformer and power switches according another example embodiment.

The transformers disclosed herein may be employed as DC-DC transformers, AC-DC transformers, etc. In some particular examples, the transformers may be suitable for high voltage applications. Additionally, the transformers may be employed in various different power supplies. For example, FIG. 14 illustrates a switched mode power supply (SMPS) 1400 including the transformer 1100 of FIG. 11 and one or more power switches 1402 coupled to the transformer 1100. In other embodiments, another suitable transformer (including the transformers disclosed herein) having an egg-shaped continuous coil may be employed if desired.

The SMPS 1400 may be a DC-DC power supply, AC-DC power supply, etc. In some embodiments, the SMPS 1400 may provide a 500 VDC/12 kW output. In other embodiments, the SMPS 1400 may provide another suitable output.

The egg-shaped continuous coils disclosed herein may be formed of one or more suitable conductor(s). For example, the conductor(s) may be one or more flat conductors as shown in FIGS. 1-11. This may allow for proper insulation between turns of the continuous coils. Additionally, the continuous coils may be rated for at least 30 volts, or another suitable voltage. The coils interleaved with the egg-shaped continuous coils may include one or more wires and/or other suitable conductors. In some examples, the coils interleaved with the continuous coils may be bifilar coils. The conductors disclosed herein may be formed of copper, aluminum, and/or another suitable material.

By employing a transformer with an egg-shaped continuous coil interleaved with another coil (e.g., a circular shaped coil) as explained herein, the coils may experience a balanced coupling substantially throughout the turns without requiring external interconnections between the turns of the continuous coils. Additionally, employing the continuous coils disclosed herein reduces manufacturing time and costs by reducing required material. Further, burrs and other sharp edges, which may damage insulation of adjacent coil(s) and cause high potential (hipot) failures, may be reduced by using the continuous coils.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A helical coil assembly for an inductive component, the helical coil assembly comprising:
    a first continuous winding assembly comprising a first plurality of turns formed by a first conductor in a first spiraling pattern, each turn of the first plurality of turns comprising a pair of opposing curved ends; and
    a second continuous winding assembly comprising a second plurality of turns formed by a second conductor in a second spiraling pattern; and
    wherein:

the first conductor comprises a flat conductor;

the second conductor comprises a non-flat conductor;

a first curved end of the pair of opposing curved ends of a first turn of the first plurality of turns has a first radius of curvature; and a second curved end of the pair of opposing curved ends of the first turn has a second radius of curvature different from the first radius of curvature.

2. The helical coil assembly of claim 1, wherein the second spiraling pattern comprises a plurality of layers aligned with and spaced apart from each other.

3. The helical coil assembly of claim 1, wherein the first conductor includes opposing ends, the helical coil assembly further comprising an input lead extending from one of the opposing ends of the first conductor and an output lead extending from the other opposing end of the first conductor, the input lead and the output lead extending in the same plane.

4. The helical coil assembly of claim 1, wherein the turns of the first plurality of turns substantially overlap each other.

5. The helical coil assembly of claim 1, wherein the first curved end of the pair of opposing curved ends of a second turn of the first plurality of turns has a third radius of curvature different from the first and second radii of curvature; and wherein the second curved end of the pair of opposing curved ends of the second turn has a fourth radius of curvature different from the third radius of curvature.

6. A transformer comprising a secondary winding comprising the first continuous winding assembly of claim 1 and a primary winding comprising the second continuous winding assembly interleaved with the secondary winding.

7. The transformer of claim 6, wherein the primary winding is substantially circular.

8. The transformer of claim 6, wherein the first plurality of turns comprises two turns, wherein the primary winding is interleaved with the two turns.

9. The transformer of claim 6, wherein the secondary winding comprises one or more additional continuous winding assemblies extending in a parallel configuration with the first continuous winding assembly.

10. The transformer of claim 6, wherein the turns of the first plurality of turns of the secondary winding are not connected together with an external interconnection.

11. The transformer of claim 6, further comprising a core, wherein the primary winding and the secondary winding are positioned about the core.

12. A coil assembly for an inductive component, the coil assembly comprising:

a first plurality of turns formed by a first continuous conductor, the first plurality of turns defining an opening having an axis;

a second plurality of turns formed by a second continuous conductor, the second plurality of turns interleaved with the first plurality of turns;

wherein each turn of the first plurality of turns comprises:

an outer turn;

an inner turn opposite the outer turn;

wherein at least a portion of the outer turn and at least a portion of the inner turn are positioned in a plane extending perpendicular to the axis;

wherein the outer turn has a first radius;

wherein the inner turn has a second radius different from the first radius wherein the first continuous conductor comprises a flat conductor; and wherein the second continuous conductor comprises a non-flat conductor.

13. The coil assembly of claim 12, wherein the turns of the first plurality of turns are not concentrically aligned.

14. The coil assembly of claim 12, wherein the first continuous conductor comprises a flat conductor.

15. The coil assembly of claim 12, wherein the first continuous conductor is defined by a top side and a bottom side, the coil assembly further comprising:

an input lead extending from one of the top side and the bottom side; and an output lead extending from the other one of the top side and the bottom side.

16. The coil assembly of claim 15, wherein the input lead and the output lead extend in parallel planes.

17. A transformer comprising a secondary winding including the coil assembly of claim 12 and at least one primary winding interleaved with the coil assembly.

18. A power supply including the transformer of claim 17.

19. The helical coil assembly of claim 2, wherein each layer of the plurality of layers comprises a plurality of turns.

20. The helical coil assembly of claim 2, wherein each layer of the plurality of layers comprises seven turns.

* * * * *